United States Patent
Liu et al.

(10) Patent No.: US 10,818,608 B2
(45) Date of Patent: Oct. 27, 2020

(54) CAGE-SHIELDED INTERPOSER INDUCTANCES

(71) Applicant: Credo Technology Group Limited, Grand Cayman (KY)

(72) Inventors: Xike Liu, Shanghai (IN); Yifei Dai, Shanghai (IN)

(73) Assignee: Credo Technology Group Limited, Grand Cayman (KY)

(*) Notice: Subject to any disclaimer, the term of this patent is extended or adjusted under 35 U.S.C. 154(b) by 0 days.

(21) Appl. No.: 15/781,782

(22) PCT Filed: Apr. 10, 2017

(86) PCT No.: PCT/CN2017/079880
§ 371 (c)(1),
(2) Date: Jun. 6, 2018

(87) PCT Pub. No.: WO2018/187899
PCT Pub. Date: Oct. 18, 2018

(65) Prior Publication Data
US 2020/0273809 A1     Aug. 27, 2020

(51) Int. Cl.
*H01L 23/552*     (2006.01)
*H01L 23/00*     (2006.01)
(Continued)

(52) U.S. Cl.
CPC ....... *H01L 23/552* (2013.01); *H01F 17/0013* (2013.01); *H01L 23/49816* (2013.01);
(Continued)

(58) Field of Classification Search
CPC ..... H01L 2224/73265; H01L 23/49816; H01L 24/16; H01L 23/5385; H01L 23/552;
(Continued)

(56) References Cited

U.S. PATENT DOCUMENTS

| 4,686,488 A | 8/1987 | Attenborough |
| 5,768,268 A | 6/1998 | Kline et al. |

(Continued)

FOREIGN PATENT DOCUMENTS

| CN | 101990690 A | 3/2011 |
| CN | 102132362 A | 7/2011 |

(Continued)

OTHER PUBLICATIONS

International Search Report and Written Opinion dated Jan. 11, 2018, in PCT/CN17/79880.
(Continued)

*Primary Examiner* — Sung S Ahn
(74) *Attorney, Agent, or Firm* — Ramey & Schwaller LLP; Daniel J. Krueger

(57) ABSTRACT

Disclosed microelectronic assemblies employ an integrated interposer cage to reduce electromagnetic interference with (and from) high-frequency components. One illustrative embodiment includes: at least one IC die having drive cores for a plurality of oscillators, the IC die attached in a flip-chip configuration to a (interposer) substrate, the substrate having: multiple inductors electrically coupled to said drive cores and each enclosed within a corresponding conductive cage integrated into the substrate to reduce mutual coupling between the inductors and noise coupled through substrate. An illustrative interposer embodiment includes: upper contacts arranged to electrically connect with micro bumps on at least one IC die; metallization and dielectric layers that form multiple inductors each surrounded by bars of a conductive cage; lower contacts arranged to electrically connect with bumps on a package substrate; and a substrate with a plurality of TSVs (through-silicon vias) that electrically couple to the lower contacts. Each of the bars includes: at least one of said TSVs, at least one via through the
(Continued)

metallization and dielectric layers, and at least one upper contact.

19 Claims, 5 Drawing Sheets

(51) Int. Cl.
| | | |
|---|---|---|
| H01L 23/538 | (2006.01) | |
| H01L 23/498 | (2006.01) | |
| H01L 23/64 | (2006.01) | |
| H03B 5/12 | (2006.01) | |
| H01F 17/00 | (2006.01) | |
| H04L 7/00 | (2006.01) | |

(52) U.S. Cl.
CPC ...... *H01L 23/5384* (2013.01); *H01L 23/5385* (2013.01); *H01L 23/5386* (2013.01); *H01L 23/645* (2013.01); *H01L 24/16* (2013.01); *H01L 24/81* (2013.01); *H03B 5/1212* (2013.01); *H03B 5/1228* (2013.01); *H04L 7/0008* (2013.01); *H01F 2017/002* (2013.01); *H01F 2017/008* (2013.01); *H01L 2224/16227* (2013.01); *H01L 2224/81801* (2013.01); *H01L 2924/3025* (2013.01)

(58) Field of Classification Search
CPC ... H01L 23/5384; H01L 23/645; H01L 24/81; H01L 2224/16227; H01L 2224/81801; H01L 2924/3025; H01F 17/0013; H01F 2017/0002; H01F 2017/008; H03B 5/1212; H03B 5/1228; H04L 7/0008
See application file for complete search history.

(56) References Cited

U.S. PATENT DOCUMENTS

| | | |
|---|---|---|
| 6,678,842 B1 | 1/2004 | Shaffer et al. |
| 7,058,150 B2 | 6/2006 | Buchwald et al. |
| 7,151,430 B2 | 12/2006 | Mattsson |
| 7,629,859 B2 | 12/2009 | Rai |
| 7,948,064 B2 | 5/2011 | Barth et al. |
| 8,183,971 B2 | 5/2012 | Le Guillou et al. |
| 8,718,550 B2 | 5/2014 | Zhao et al. |
| 8,823,133 B2 | 9/2014 | Jenkins et al. |
| 9,177,709 B2 | 11/2015 | Parthsarathy et al. |
| 9,385,859 B2 | 7/2016 | Kuan et al. |
| 9,490,222 B1 | 11/2016 | Awujoola et al. |
| 10,313,105 B2 | 6/2019 | Gao et al. |
| 10,483,910 B2 | 11/2019 | Gao |
| 2007/0182502 A1 | 8/2007 | Shin et al. |
| 2007/0246805 A1* | 10/2007 | Zhang ............... H01L 24/73 257/659 |
| 2008/0278825 A1 | 11/2008 | Hung et al. |
| 2010/0140758 A1* | 6/2010 | Doherty ............ H01L 23/481 257/659 |
| 2011/0057759 A1 | 3/2011 | Gianesello |
| 2012/0044034 A1 | 2/2012 | Nazarian et al. |
| 2013/0149995 A1 | 6/2013 | Guionnet |
| 2014/0225706 A1* | 8/2014 | Doyle .............. H01F 17/0006 336/84 M |
| 2015/0003505 A1 | 1/2015 | Lusted et al. |
| 2016/0092625 A1 | 3/2016 | Nazarian |
| 2016/0337114 A1 | 11/2016 | Baden et al. |
| 2018/0219513 A1 | 8/2018 | Gao |
| 2020/0083316 A1 | 3/2020 | Cheng |

FOREIGN PATENT DOCUMENTS

| | | |
|---|---|---|
| CN | 102376415 A | 3/2012 |
| CN | 104584152 A | 4/2015 |
| CN | 108701525 A | 10/2018 |
| CN | 109314095 A | 2/2019 |
| CN | 109495106 A | 3/2019 |
| WO | 201314995 A1 | 10/2013 |

OTHER PUBLICATIONS

Non-Final Office Action dated Jan. 24, 2018, in U.S. Appl. No. 15/487,045.
International Search Report and Written Opinion May 9, 2017, in International Application No. PCT/CA16/91836.
Final Office Action dated Apr. 19, 2019, in U.S. Appl. No. 15/423,398.
Non-Final Office Action dated Oct. 4, 2018, in U.S. Appl. No. 15/702,715.
Non-Final Office Action dated Oct. 17, 2018, in U.S. Appl. No. 15/423,398.
Notice of Allowance dated Mar. 8, 2019, in U.S. Appl. No. 15/702,715.
Ohliger, Michael A., et al. An Introduction to Coil Array Design for Parallel MRI, Wiley InterScience, 2006, 300-315, 19, John Wiley & Sons, Ltd.
Non-Final Office Action dated Jan. 16, 2020 in U.S. Appl. No. 16/653,701.
Chinese Office Action dated Aug. 30, 2018 for CN Application No. 201680023305.1.
Notice of Allowance dated Nov. 19, 2019 for U.S. Appl. No. 15/423,398.
Notice of Allowance received May 6, 2020 in U.S. Appl. No. 16/653,701.
Notice of Allowance received May 20, 2020 in U.S. Appl. No. 16/653,701.
Non Final Office Action received Jan. 16, 2020 in U.S. Appl. No. 16/653,701.
International Search Report and Written Opinion dated May 9, 2017 in PCT/CN2016/091836.
International Preliminary Report on Patentability dated Jan. 29, 2019 in PCT/CN2016/091836.
International Search Report and Written Opinion dated Jan. 11, 2018 in PCT/CN2017/079880.
Yang, Ching-Yuan; A High-Frequency CMOS Multi-Modulus Divider for PLL Frequency Synthesizers; Analog Integr Circ Sig Process; 2008; pp. 155-162; vol. 55; Springer Science+Business Media, LLC.
Chinese First Office Action dated Oct. 31, 2019 in Chinese Application No. 201680023305.1.
Chinese Second Office Action dated Mar. 20, 2020 in Chinese Application No. 201680023305.1.
Non-Final Office Action dated Aug. 15, 2019 in U.S. Appl. No. 16/099,401.

* cited by examiner

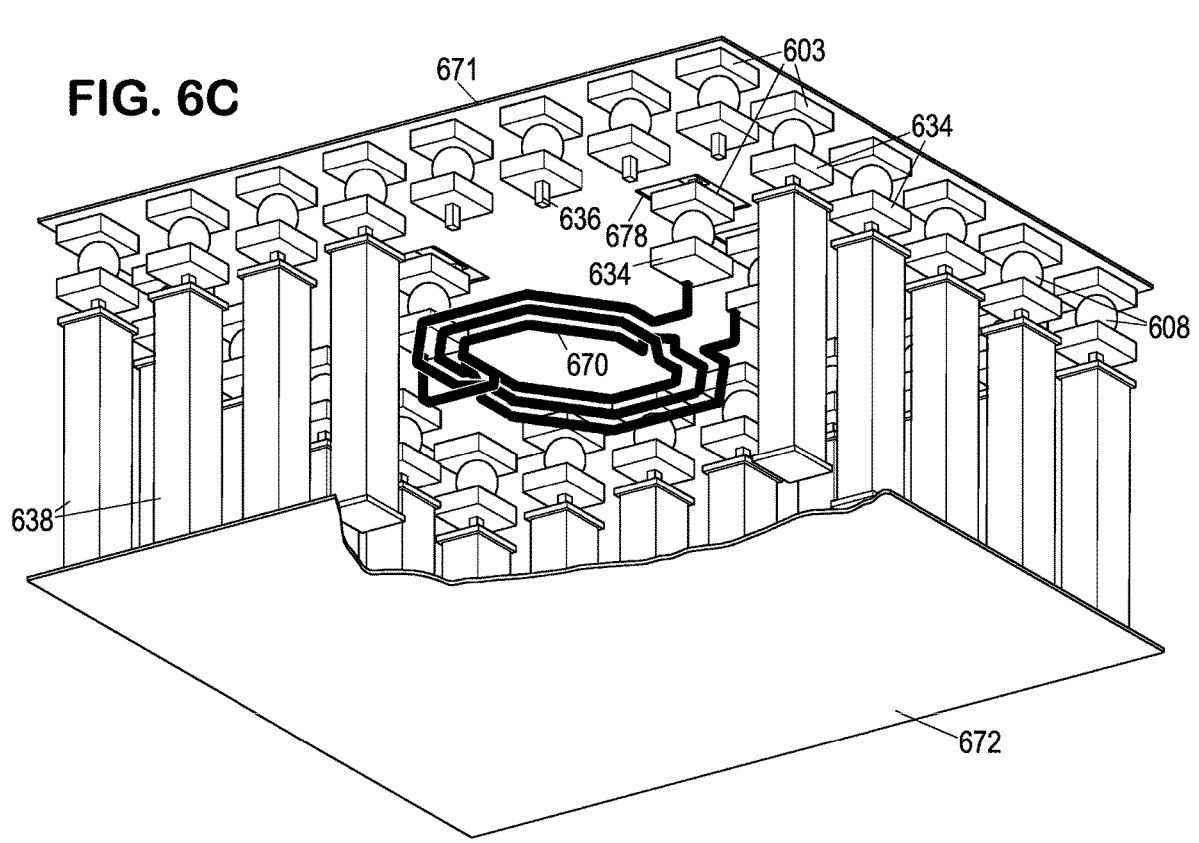

CAGE-SHIELDED INTERPOSER INDUCTANCES

BACKGROUND

Digital communications occur between sending and receiving devices over an intermediate communications medium, e.g., a fiber optic cable or insulated copper wire, having one or more designated communications channels, e.g., carrier wavelengths or frequency bands. Each sending device typically transmits symbols at a fixed symbol rate, while each receiving device detects a (potentially corrupted) sequence of symbols and attempts to reconstruct the transmitted data.

A "symbol" is a state or significant condition of the channel that persists for a fixed period of time, called a "symbol interval." A symbol may be, for example, an electrical voltage or current level, an optical power level, a phase value, or a particular frequency or wavelength. A change from one channel state to another is called a symbol transition. Each symbol may represent (i.e., encode) one or more binary bits of the data. Alternatively, the data may be represented by symbol transitions, or by a sequence of two or more symbols. The simplest digital communication links use only one bit per symbol; a binary '0' is represented by one symbol (e.g., an electrical voltage or current signal within a first range), and binary '1' by another symbol (e.g., an electrical voltage or current signal within a second range). Channel non-idealities produce dispersion which may cause each symbol to perturb its neighboring symbols, causing intersymbol interference (ISI). As the symbol rate increases, ISI can make it difficult for the receiving device to determine which symbols were sent in each interval, particularly when such ISI is combined with additive noise.

As part of the process for recovering digital data from the degraded analog signal, receivers obtain discrete samples of the signal. The sample timing is often a critical part of the process, as it directly affects the signal to noise ratio possessed by the discrete samples. Strategies for detecting and tracking optimal sample times exist with varying degrees of tradeoff between simplicity and performance. In multi-channel environments, additional performance considerations must be taken into account when determining the optimal balance between simplicity and performance. Such performance considerations include timing jitter attributable to electromagnetic field interference with inductors in clock recovery modules. At high data rates (e.g., in excess of 25 Gb/s), timing jitter can be a critical performance factor.

One potential cause of timing jitter in a variable frequency oscillator is noise or interference from other nearby oscillators, and in particular, electromagnetic interference between inductors of the integrated oscillators in a multi-channel transceiver. Previous attempts to minimize such interference have employed wide spacing, which is wasteful of die space, and inductor loop arrangements that reduce the radiated fields at the cost of significantly increased conductor lengths (and hence increased inductor resistance) while continuing to demand an undesirable amount of area on the integrated circuit dice.

SUMMARY

Accordingly, there are disclosed herein microelectronic assemblies and methods employing an integrated interposer cage to reduce electromagnetic interference with (and from) high-frequency components such as inductors. One illustrative microelectronic assembly embodiment includes: at least one IC (integrated circuit) die having drive cores for a plurality of oscillators; and an (interposer) substrate electrically connected to the at least one IC die in a flip-chip configuration, the substrate having: multiple inductors, each of said multiple inductors being electrically coupled to a corresponding one of said drive cores; and a plurality of conductive cages integrated into the substrate, each of said drive cores associated with a respective one of the conductive cages that reduces electromagnetic interference with the one or more of said multiple inductors coupled to that drive core.

An illustrative interposer embodiment includes: upper contacts arranged to electrically connect with micro bumps on at least on IC (integrated circuit) die; metallization and dielectric layers that form multiple inductors each surrounded by bars of a conductive cage; lower contacts arranged to electrically connect with bumps on a package substrate; and an interposer substrate with a plurality of TSVs (through-silicon vias) that electrically couple to the lower contacts. Each of the bars includes: at least one of said TSVs, at least one via through the metallization and dielectric layers, and at least one upper contact.

An illustrative method embodiment for reducing electromagnetic interference between multiple oscillators in a microelectronic assembly, includes: coupling at least one IC (integrated circuit) die to a substrate in a flip-chip configuration, the at least one IC die having drive cores for the oscillators. As part of this coupling, the method includes: electrically connecting each drive core to an inductor on the substrate; and providing an upper boundary of a conductive cage around at least one of said inductors by electrically connecting a conductive surface or mesh layer of the at least one IC die to conductive cage bars on the substrate.

Each of the foregoing embodiments may be employed alone or in combination, and may further be implemented with any one or more of the following optional features in any suitable combination:

the at least one IC die includes a conductive mesh or surface layer that forms an upper boundary of at least one cage in the plurality of conductive cages.
the conductive mesh or surface layer is electrically connected to said at least one cage via micro bumps or other conductive interconnections.
each of the plurality of conductive cages comprises an arrangement of electrically-connected vias around the one or more of said multiple inductors coupled to a given drive core.
the substrate may be a package substrate or an interposer.
each of the plurality of conductive cages comprises an arrangement of electrically-connected TSVs (through-silicon vias) around the one or more of said multiple inductors coupled to a given drive core.
the multiple inductors are formed on an upper metal layer of the interposer.
the interposer may include a lower surface having a conductive surface or mesh layer that forms a lower boundary of at least one cage in the plurality of conductive cages.
the microelectronic assembly further includes a package substrate electrically connected to the interposer via an array of solder bumps.
the package substrate may include a conductive surface layer that forms a lower boundary of at least one cage in the plurality of conductive cages.
the surface layer is electrically connected to said at least one cage via solder bumps in said array.

the plurality of oscillators are adjustable-frequency oscillators.

the at least one IC die comprises at least one receiver employing one of the plurality of oscillators for clock recovery, and further comprises another receiver or transmitter employing another of the plurality of oscillators.

the interposer may include a conductive ring electrically connecting the bars.

the interposer includes a conductive surface or mesh electrically connecting the bars on a lower side of the interposer substrate.

the substrate is an interposer having its upper contacts connected to contacts on the at least one IC die.

the method further includes: soldering lower contacts of the interposer to internal contacts of a package substrate, wherein said soldering includes providing a lower boundary of the conductive cage by electrically connecting a conductive surface or mesh layer of the package substrate to the conductive bars.

the substrate includes cage bars for providing each inductor with a respective conductive cage.

each cage bar includes a contact path to at least one IC die surface layer, a contact path to the package substrate.

BRIEF DESCRIPTION OF THE DRAWINGS

In the drawings:

FIG. 6C is a cut-away isometric view of an integrated interposer cage.

Figure 1:
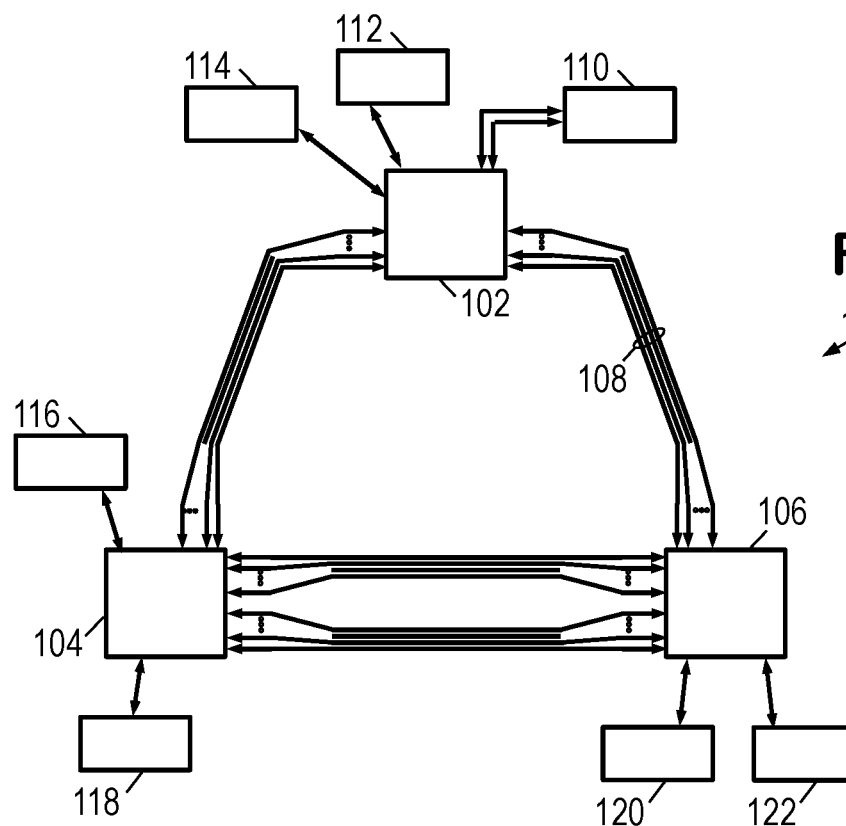
FIG. 1 shows an illustrative computer network.

It should be understood, however, that the specific embodiments given in the drawings and detailed description do not limit the disclosure. On the contrary, they provide the foundation for one of ordinary skill to discern the alternative forms, equivalents, and modifications that are encompassed in the scope of the appended claims.

Terminology

An integrated circuit ("IC") die is a diced unit of an IC wafer. (Herein, "dice" will be employed as the plural form of a die.) The packaged form of a singular IC die, with nodes, pins, posts, pads, terminals, leads, bumps, balls, or other electrical contacts (collectively referenced herein as "contacts") ready for soldering or other electrically-connected incorporation into a larger electrical circuit or system, may be termed an IC chip. When multiple IC dice are packaged together, e.g., as a multi-chip module or system-in-package, the packaged unit is herein termed a "microelectronic assembly". The multiple IC dice may be attached directly to the package substrate, which can take the form of a laminated circuit board or a ceramic, glass, or semiconductor substrate, and generally has printed or etched traces significantly (orders of magnitude) larger than the traces on the IC dice. As this size discrepancy can adversely affect communications performance between the IC dice, at least some microelectronic assemblies employ so-called 2.5D or 3D technologies. In 3D technology, the IC dice are stacked atop each other to provide direct electrical connections between adjacent dice. However, such stacking can make it difficult for the package to provide adequate heat dissipation. In 2.5D technology, at least some of the IC dice are attached to an "interposer", which in turn may be attached to the package substrate. The interposer may be a silicon substrate that employs through-silicon vias (TSVs) to provide contacts on both its upper surface (for the IC dice) and its lower surface (for the package substrate). Traces on the interposer can more closely match the size of the traces on the IC dice for improved communications performance between the dice, and may incorporate intentional inductance and capacitance elements to provide better impedance matching with the contacts and traces on the package substrate. So long as their density and power dissipation is constrained, a limited number of active devices (e.g., transistors) may be incorporated into the interposer without facing the heat dissipation difficulties of 3D technology.

The term "substrate", when unqualified, may refer to a package substrate, an interposer, an IC die, or any other form of platform that provides contacts for electrically connecting the integrated circuit elements of the die to the other elements or external contacts of the microelectronic assembly.

DETAILED DESCRIPTION

The disclosed apparatus and methods are best understood in with reference to an illustrative context. Accordingly, FIG. 1 shows an illustrative communications network 100 having communications links 108 interconnecting nodes 102, 104, 106 (representing switches, routers, base stations, gateways, and other forms of communications equipment) that direct and relay communications signals between terminal nodes 110-122 (which may represent mobile devices, portable computers, workstations, servers, network-attached storage systems, and other such communications sources and destinations). The communications network 100 may be or include, for example, the Internet, a wide area network, or a local area network.

Communication links 108 may be wired or wireless communication channels. As one example, the communication links may be fiber optic cables having bundles of optical fibers each carrying multiple modulated light signals on corresponding channels. Many fiber optic cables have multiple bundles of optical fibers, with each fiber carrying multiple channels. With such dense packing of information signals (which can also be found in other forms of wireless or wired communications links), highly integrated communications transceivers are advantageous for efficient interfacing with communications equipment. It is desirable to combine the integrated circuits for multiple transmitter modules and multiple receiver modules into a single packaged unit, such as a microelectronic assembly. Such an environment presents potential issues of interference between the various transmitter or receiver modules.

Figure 2:
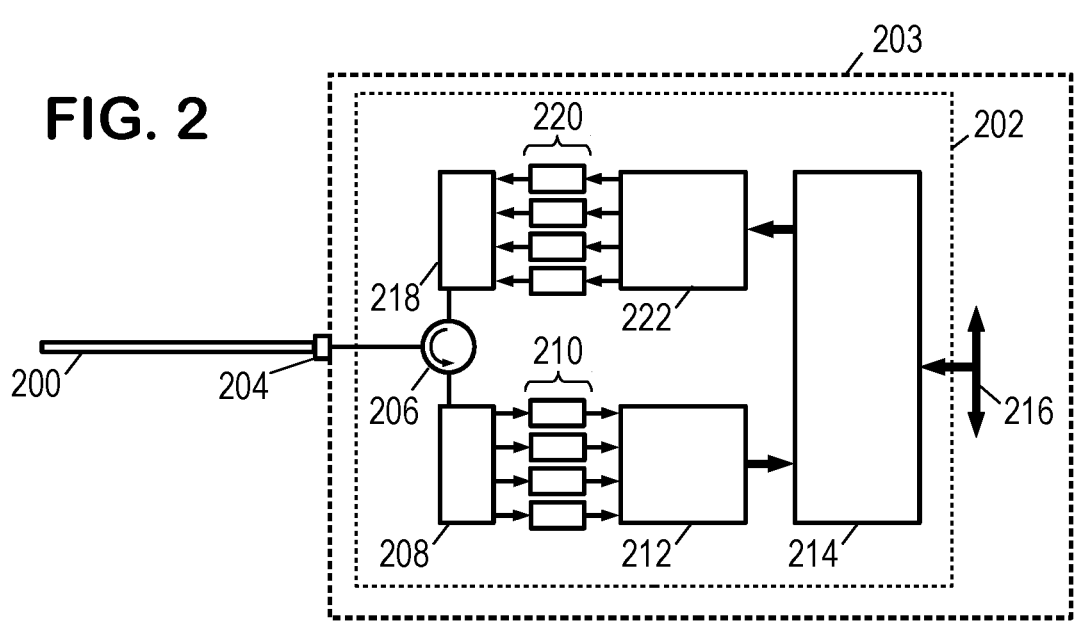
FIG. 2 is a function-block diagram of an illustrative transceiver.

FIG. 2 shows one such optical fiber 200 coupled to an illustrative transceiver 202 in a terminal node 203. (Each optical fiber in a bundle may be coupled to a different transceiver in the terminal node.) An optical connector 204 couples the fiber 200 to an optical circulator 206. The circulator 206 forwards incoming light signals to a channel splitter 208, which separates the various channels and provides one to each detector 210. The multiple detectors 210 each convert one of the light signals into an electrical receive signal. An integrated multi-channel receiver 212 operates on the electrical receive signals to extract the corresponding streams of digital data. An interface module 214 buffers the streams of digital data and converts them to a suitable format for communications of the terminal node's internal bus 216, in accordance with a standard I/O bus protocol. In some embodiments, the conversion performed by the interface module includes error correction and payload extraction.

From the internal bus 216, the interface module 214 also accepts digital data for transmission. In at least some embodiments, the interface module 214 packetizes the data with appropriate headers and end-of-frame markers, optionally adding a layer of error correction coding and/or a checksum. A multichannel transmitter 222 accepts the transmit data streams from interface module 214 and converts the digital signals into analog electrical drive signals for emitters 220, causing the emitters to generate optical signals that are coupled to a channel coupler 218. The channel coupler 218 provides them as a combined optical signal to the circulator 206, which forwards it as an outgoing signal to optical fiber 200. Though the illustrated embodiment shows multichannel receiver 212 and multichannel transmitter 222 as separate 4-channel devices, the contemplated embodiments include a microelectronic assembly with transmit and receive capabilities (i.e., a transceiver) for up to 16 channels. This contemplated embodiment is illustrative and not limiting.

Light signal modulation can be performed at extremely high symbol rates, necessitating that the receiver digitize the electrical receive signals at correspondingly high sampling rates without sacrificing the precision required for maintaining an adequate signal-to-noise ratio.

Figure 3:
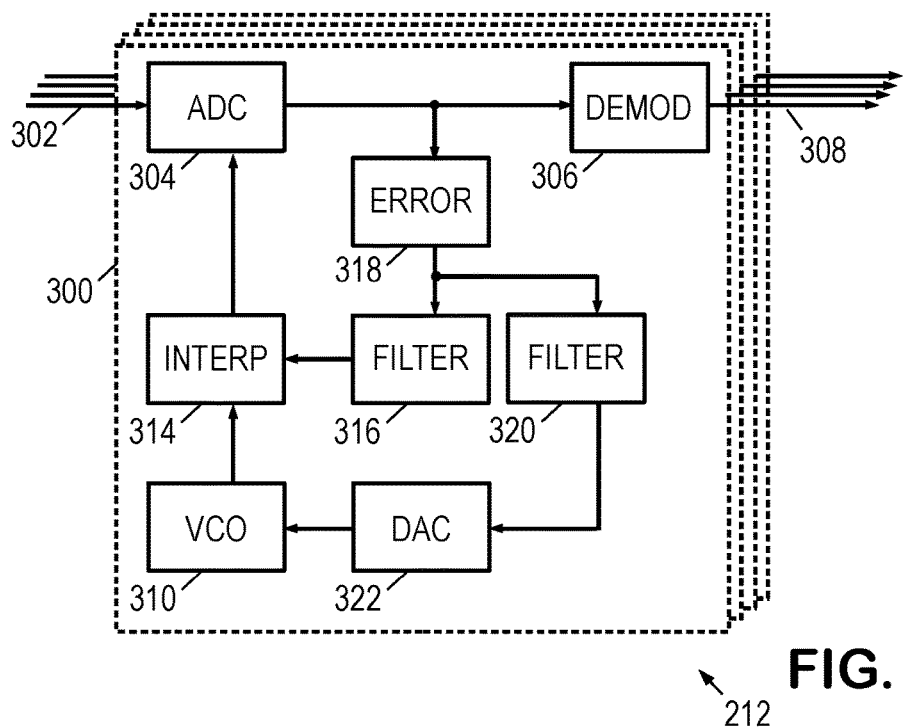
FIG. 3 is a function-block diagram of an integrated multi-channel receiver with potentially independent clock recovery modules.

FIG. 3 shows one "clock and data recovery" technique implemented by illustrative integrated multichannel receiver 212. The receiver 212 includes an individual receive module 300 for each of the electrical receive signals 302. Within each receive module 300, an analog-to-digital converter 304 samples the analog receive signal 302 at sample times corresponding to transitions in a clock signal, thereby providing a digital receive signal to a demodulator 306. The demodulator 306 applies equalization and symbol detection using, e.g., a matched filter, a decision feedback equalizer, a maximum likelihood sequence estimator, or any other suitable demodulation technique. The resulting stream of demodulated symbols 308 may be supplied to the interface module 214.

To derive a suitable clock signal for sampling, the receive module 300 employs a clock recovery module which includes a voltage controlled oscillator (VCO) 310, a phase interpolator 314, a phase control filter 316, a timing error estimator 318, a frequency control filter 320, and a digital to analog converter (DAC) 322. VCO 310 receives a control signal from DAC 322 and responsively generates an oscillating signal (from which a clock signal can be derived) with a frequency corresponding to the voltage of the control signal. Due to feedback, the oscillating signal frequency closely approximates the nominal symbol frequency of the receive signal 302. Nevertheless, at least some drift of the sampling phase and frequency is expected.

A phase interpolator 314 converts the clock signal to a suitable sampling signal for analog-to-digital converter 304, correcting for phase offsets. Phase control filter 316 provides the appropriate phase correction signal to the interpolator 314. To determine the appropriate phase correction, the phase control filter operates on a sequence of timing error estimates received from timing error estimator 318.

Timing error estimator 318 may operate using any of the suitable timing error estimation techniques disclosed in the open literature. Such techniques may first determine an amplitude error for each sample, e.g., by comparing the sample to an ideal amplitude (perhaps the amplitude of an uncorrupted symbol), or by determining a difference between the sample and the nearest decision threshold and subtracting that difference from the symbol margin. In some embodiments, the amplitude error is then correlated with the signal slope to obtain the timing error. In other embodiments, the amplitude error is correlated with the preceding symbol value or polarity to estimate the timing error. Still other embodiments employ oversampling and correlate the amplitude error with neighboring samples or differences between such neighboring samples to estimate the timing error.

Regardless of how it is obtained, the error estimate is preferably an unbiased estimate of timing error, but may alternatively be a binary sequence indicating whether the sample was acquired early (before the ideal sampling time) or late (after the ideal sampling time). From the timing error signal, the phase control filter 316 estimates the clock signal's phase error to determine at any given instant the phase adjustment that the phase interpolator 314 should apply to compensate.

Separately from the phase control filter 316, a frequency control filter 320 operates on the timing error estimates to produce a frequency control signal. DAC 322 converts the frequency control signal from digital form to an analog frequency control signal having its value represented as a voltage. In some embodiments, the digital to analog converter provides 10-bit resolution. In other embodiments, the digital-to-analog converter is followed by a low-pass analog filter that filters the analog frequency control signal before it is applied to the VCO.

The VCO 310 produces an oscillating signal having a frequency corresponding to the value of the analog frequency control signal. This oscillating signal is converted into a digital clock signal that is supplied to the phase interpolator 314. The frequency control filter 320 operates to minimize any frequency offset between the clock signal and the digital receive signal, which indirectly minimizes any frequency offset between the sampling signal and the digital receive signal.

In at least some embodiments, the frequency control filter 320 is a filter with a recursive component. The phase control filter 316 may be a moving average filter or it too may include a recursive component. In at least some contemplated embodiments, the time constant of the frequency control filter is greater than eight times the time constant of the phase control filter.

Figure 4:
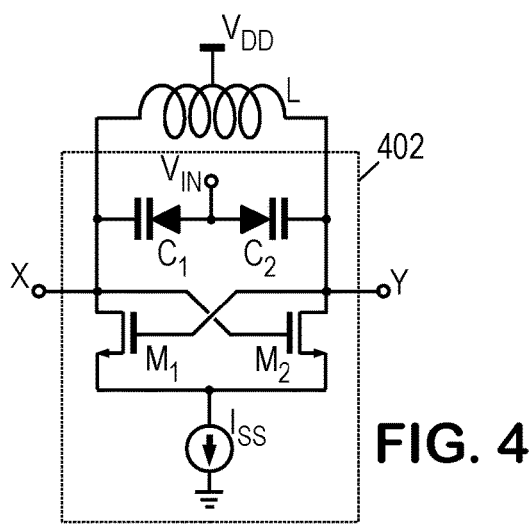
FIG. 4 is a circuit diagram of an illustrative voltage-controlled oscillator.

An illustrative VCO circuit schematic is shown in FIG. 4 to illustrate the potential use of a loop inductor by an oscillator drive core 402. Many other suitable VCO circuits are available in the open literature and can alternatively be employed. When power is first applied, the transistors M1, M2 are both off and currents begin flowing through the halves of inductor L to charge the capacitors (varactors) C1, C2 relative to the control signal voltage ($V_{IN}$), raising the voltage at nodes X, Y. One of the nodes, say node Y, charges slightly faster, causing transistor M1 to conduct while transistor M2 is still off. Current source $I_{SS}$ reduces the voltage at node X, momentarily "latching" the transistors in their state. Due to the inductor current, the node Y voltage continues to increase charging capacitor C2 beyond the supply voltage $V_{DD}$ until the inductor current is suppressed and begins flowing in the opposite direction, pulling the node Y voltage down to a level that causes transistor M1 to turn off and, because the inductor current flow exceeds $I_{SS}$, raises the voltage at node X, causing transistor M2 to turn on. Thereafter, the inductor current and capacitor charges oscillate at a frequency determined by the inductor's inductance and the varactor's capacitance.

The transistors M1, M2 enable the current source $I_{SS}$ to "boost" the inductor currents at the right moments to sustain the oscillation. If the voltages from nodes X, Y are supplied to a differential amplifier, a digital clock signal is produced at the resonance frequency. Capacitors C1, C2 may be voltage-controlled capacitors (varactors), enabling the resonance frequency to be controlled by a bias voltage Vin on the capacitors.

Figure 5:
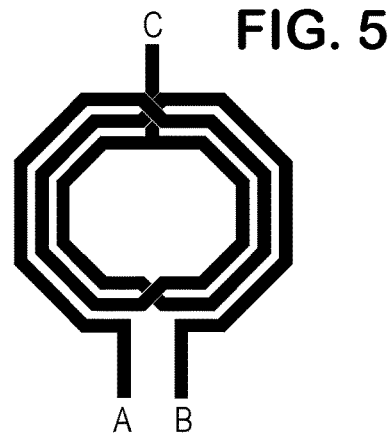
FIG. 5 is layout schematic of an illustrative loop inductor configuration.

The integrated multi-channel receiver design of FIG. 3 employs multiple oscillators on a single IC die. Integrated transceiver designs (having a transmitter and receiver on the same IC die or in the same microelectronic assembly) may also call for the use of multiple oscillators. As described with reference to FIG. 4, the contemplated VCOs each include a center-tapped inductor coil as part of a resonant circuit. One illustrative inductor layout is shown in FIG. 5, with two end taps A, B, and a center tap C. The illustrated loop inductor has a single loop with three windings.

Notably, the illustrated inductor acts as a magnetic dipole, potentially causing significant electromagnetic interference with other integrated circuit elements in the proximity. At high frequencies, the inductors of the multiple oscillators can couple electromagnetically, causing clock jitter and/or oscillator frequency "pulling". If sufficient die area is available, the interference can potentially be addressed with sufficient distancing of the inductors from each other and other sensitive components. However, it may not be feasible to allocate sufficient area for the distancing approach. The following discussion presents an "interposer cage" technique for shielding such inductors to reduce the electromagnetic interference they might otherwise experience or cause. Such interference reduction can be achieved while also providing a significant reduction in the die area that would otherwise be required for the inductors.

Figure 6A:
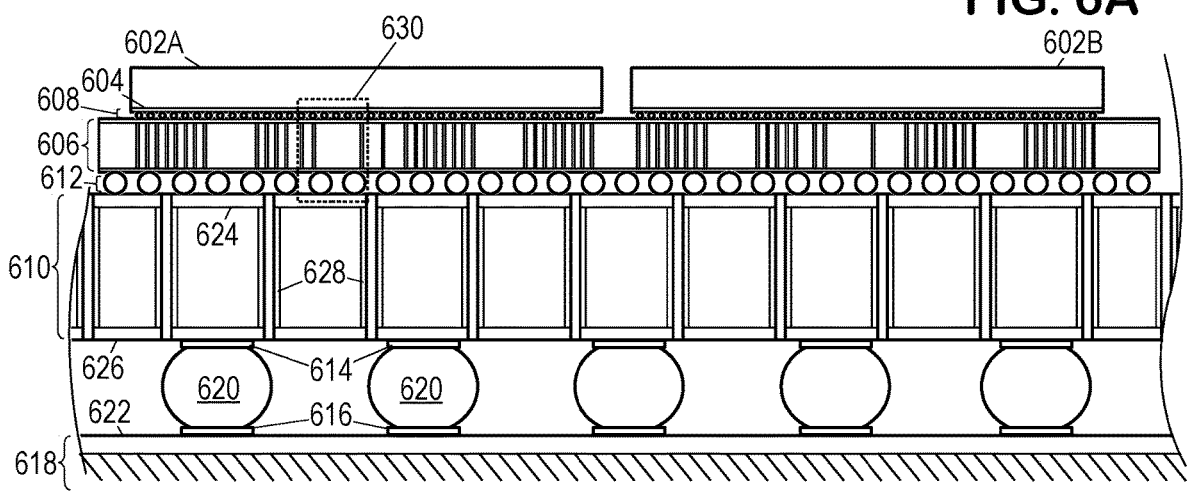
FIG. 6A is a partial cross-section of an illustrative microelectronic assembly.

FIG. 6A is a partial cross-section of an illustrative microelectronic assembly having multiple IC dice 602A, 602B with integrated circuitry 604 in a flip-chip configuration (i.e., with die substrate flipped to position the patterned areas and contacts adjacent to the mounting surface) attached to upper contacts of an interposer 606 by micro bumps 608. The lower contacts of interposer 606 are attached to the internal (upper) contacts of package substrate 610 by C4 ("Controlled Collapse Chip Connection") bumps 612. When the microelectronic assembly is incorporated into a larger system, the external (lower) contacts 614 of the package substrate 610 are attached to solder contacts 616 on the circuit board 618 (or other system substrate) by solder bumps 620. Printed circuit traces 622 on the circuit board 618, as well as vias 628 and printed circuit traces 624, 626 on the upper and lower surfaces of package substrate 610, electrically connect the C4 bumps 612 to the other components on the circuit board 618.

Though the figures are not drawn to scale, a typical micro bump diameter would be about 30 micrometers. The thickness of the IC dice 602A, 602B and interposer 606 may range as low as about 0.2 mm or slightly less, though more typical values would be about twice this minimum thickness. The interposer 606, of course, has length and width dimensions sufficient to accommodate all of the desired IC dies, and the package substrate has sufficient dimension to accommodate the interposer in turn. The typical C4 bump diameter is about 100 micrometers, with a pitch of about 160 micrometers.

Figure 6B:
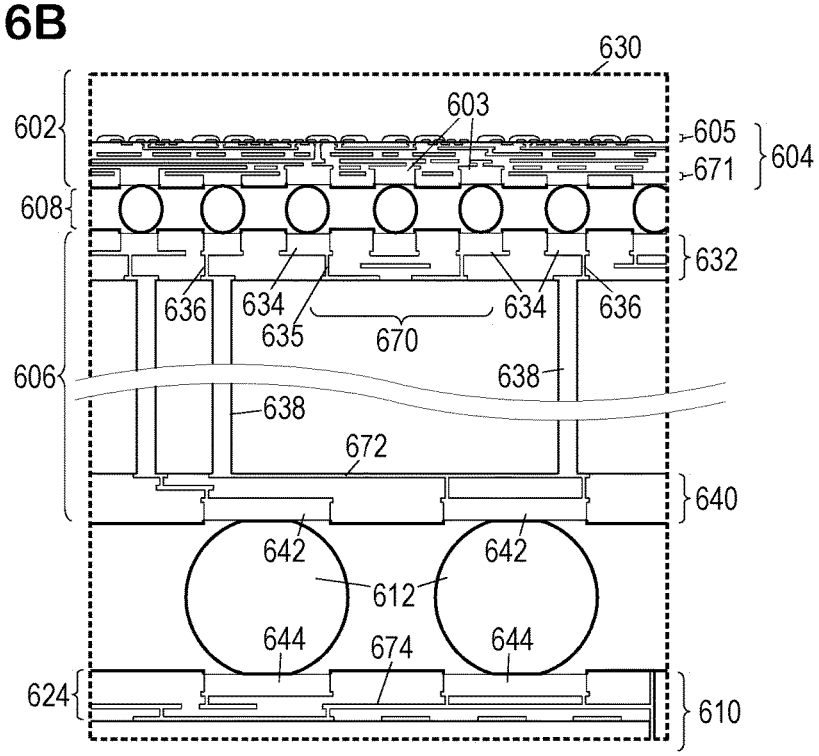
FIG. 6B is a close up view of the FIG. 6A cross-section.

FIG. 6B is a close up view of area 630 in FIG. 6A to illustrate further detail. The integrated circuitry 604 is formed from layers of dielectric, polysilicon, and/or metal deposited and patterned over diffused dopant regions 605 in accordance with established semiconductor device manufacturing techniques. The contemplated integrated circuitry 604 includes the drive cores 402 for multiple oscillators, but preferably does not include the inductors. Rather, to minimize electromagnetic interference, the inductors are preferably implemented as traces (e.g., traces 670) in the patterned upper layers 632 of interposer 606 and connected to the drive cores by selected micro bumps 608, selected upper contacts 634, and selected vias 635. Contacts 603, vias, and traces in circuitry 604 are similarly employed to complete the connections.

Selected other contacts 634 in upper layers 632 (i.e., upper contacts of interposer 606) connect by vias 636 to TSVs (through-silicon vias) 638, which penetrate the interposer substrate to enable electrical connections between the patterned upper layers 632 and patterned lower layers 640. The patterned lower layers 640 include the interposer's lower contacts 642. The C4 bumps 612 electrically connect the interposer's lower contacts 642 to the package substrate's internal (upper) contacts 644.

The traces 670 for each inductor to be driven at high frequency are preferably enclosed within a Faraday cage to minimize radiation of electromagnetic energy to or from the inductor traces 670. Preferably each inductor has its own cage, but in some contemplated embodiments where limited amounts of mutual interference are acceptable, a given cage may enclose multiple inductors.

The cage bars are formed by the TSVs 638, each with one or more vias 636 connecting the TSV to at least one upper contact 634 having a corresponding micro bump 608 connecting to a contact in integrated circuitry 604. The cage further includes a conductive surface or mesh 671 forming an upper boundary within the patterned layers of integrated circuitry 604, and may further include a conductive surface or mesh 672 or 674, forming a lower boundary. Surface 672 is provided within the lower patterned layers 640 of interposer 606, whereas surface 674 is provided within the upper patterned layers of package substrate 610. Either surface 672, 674 alone would likely be sufficient to provide a lower boundary to the Faraday cage, and some interposer designs may lack a patterned layer that could provide the conductive surface or mesh for the lower boundary.

FIG. 6C is a cut-away isometric view of an integrated interposer cage. For purposes of illustration, only the conductive elements are shown. Apertures 678 are provided in surface 671 for the IC die contacts 603 that connect (through micro bumps 608 and upper contacts 634) to the inductor terminals. The IC die contacts 603 for the cage bars electrically connect with surface 671. Surface 672 electrically connects with TSVs 638 forming the cage bars. Though not shown in this embodiment, the cage bar vias 636 may be electrically connected in a ring by a trace within the upper patterned layers 632. It is desirable for the openings between cage bars to be the minimum distance allowed by process, and in any case, significantly smaller than the wavelength of the signals imposed on the inductor.

TSVs 638 may typically have diameters of about 8 micrometers and a pitch of about 30 micrometers. Vias 636 may typically be about 1×1 micrometer square, and perhaps 1 to 2 micrometers high, with a pitch of as little as 2 micrometers. The micro bumps and upper patterned layer thickness of the interposer may combine to provide 50 micrometers of separation or more between the inductor traces 670 and the cage boundary surface 671. At the contemplated frequencies (10-25 GHz), the contemplated inductor design occupies about 100×100 micrometers of area, and the cage bars may preferably be spaced at least 40, preferably 50 or more, micrometers away from the inductor's perimeter (i.e., at least 40%, but preferably 50% or more of the diameter). The interposer 606 may provide multiple inductors with corresponding integrated Faraday cages for a given IC die, providing a substantial areal savings in combination with greatly reduced interference between the inductors.

Figure 7:
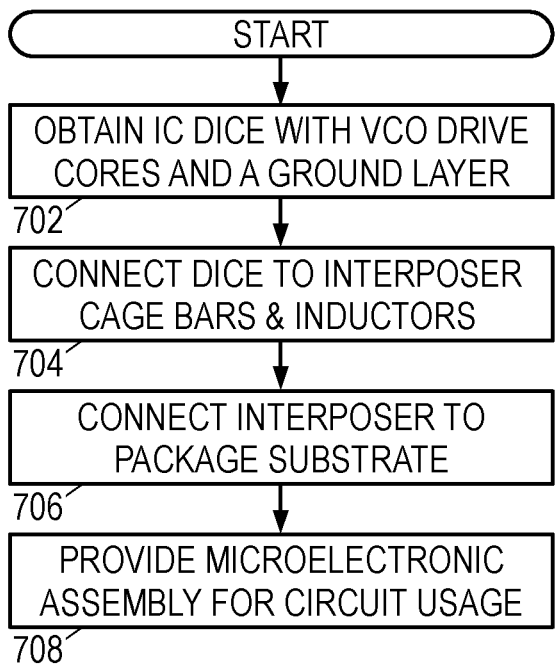
FIG. 7 is a flow diagram of an illustrative interference reduction method.

FIG. 7 is a flow diagram of an illustrative interference reduction method that employs the principles described above. In block 702, a manufacturer obtains IC dice having the drive cores for VCOs, along with a ground layer or other conductive surface or mesh that can serve as an upper boundary for the Faraday cage(s) on the interposer. The upper boundary surface may include apertures with contacts for connecting to inductor terminals. In some contemplated embodiments, the contacts for the inductor terminals may be located outside the cage and traces may be routed between the cage bars to connect the inductor terminals to these contacts.

In block 704 the manufacturer attaches the IC dice to an interposer providing the inductors enclosed within Faraday cage bars. As part of the attachment process, micro bumps are provided to electrically connect the drive cores to the inductors and the boundary surface to the cage bars.

In block 706, the manufacturer connects the interposer to the package substrate using, e.g., C4 bumps to provide electrical connection between lower contacts of the interposer and internal contacts of the package substrate.

In block 708, the manufacturer completes the packaging of the microelectronic assembly, rendering it ready for incorporation into a larger electronic system.

The foregoing principles have been discussed in a specific context for explanatory purposes. However, the reader will recognize that they are applicable in a much wider range of contexts. For example, the illustrated VCO is used for clock recovery, but VCOs are also commonly employed in phase lock loops (PLLs) for, e.g., frequency multiplication, wireless carrier generation, and clock generators. The illustrated inductors are a particularly problematic source and target of electromagnetic interference, but they are not the only electronic components which may be sensitive to such interference. Such components, or even whole circuit modules having such emissions or sensitivities, may be relocated from the IC dies to within the integrated cage to be shielded from other sources or targets of interference.

Numerous alternative forms, equivalents, and modifications will become apparent to those skilled in the art once the above disclosure is fully appreciated. For example, the foregoing description focuses on implementations having the inductor or other high-frequency component positioned in the upper patterned layers of the interposer, but the disclosed principles would also apply if the inductor or high-frequency component were positioned in the lower patterned layers of the interposer. As another example, the interposer may be omitted from the microelectronic assembly and the package substrate may be formed from silicon in a manner similar to an interposer having an integrated Faraday cage. It is intended that the claims be interpreted to embrace all such alternative forms, equivalents, and modifications that are encompassed in the scope of the appended claims.

What is claimed is:

1. A microelectronic assembly that comprises:
at least one IC (integrated circuit) die having drive cores for a plurality of oscillators; and
a substrate electrically connected to the at least one IC die in a flip-chip configuration, the substrate including:
multiple inductors, each of said multiple inductors being electrically coupled to a corresponding one of said drive cores; and
a plurality of conductive cages integrated into the substrate, each of said drive cores associated with a respective one of the conductive cages that reduces electromagnetic interference with the one or more of said multiple inductors coupled to that drive core.

2. The microelectronic assembly of claim 1, wherein the at least one IC die includes a conductive mesh or surface layer that forms an upper boundary of at least one cage in the plurality of conductive cages, and wherein the conductive mesh or surface layer is electrically connected to said at least one cage via solder bumps.

3. The microelectronic assembly of claim 1, wherein each of the plurality of conductive cages comprises an arrangement of electrically-connected vias around the one or more of said multiple inductors coupled to a given drive core.

4. The microelectronic assembly of claim 1, wherein the substrate comprises an interposer, and wherein each of the plurality of conductive cages comprises an arrangement of electrically-connected TSVs (through-silicon vias) around the one or more of said multiple inductors coupled to a given drive core.

5. The microelectronic assembly of claim 4, wherein the multiple inductors are formed on an upper metal layer of the interposer, and wherein the interposer includes a lower metal layer having a conductive surface or mesh that forms a lower boundary of at least one cage in the plurality of conductive cages.

6. The microelectronic assembly of claim 4, further comprising a package substrate electrically connected to the interposer via an array of solder bumps, wherein the package substrate includes a conductive surface or mesh layer that forms a lower boundary of at least one cage in the plurality of conductive cages, and wherein the conductive mesh or surface layer is electrically connected to said at least one cage via solder bumps in said array.

7. The microelectronic assembly of claim 1, wherein the plurality of oscillators are adjustable-frequency oscillators.

8. The microelectronic assembly of claim 1, wherein the at least one IC die comprises at least one receiver employing one of the plurality of oscillators for clock recovery, and further comprises another receiver or transmitter employing another of the plurality of oscillators.

9. An interposer that comprises:
upper contacts arranged to electrically connect with micro bumps on at least on IC (integrated circuit) die;
metallization and dielectric layers that form multiple inductors each surrounded by bars of a conductive cage;
lower contacts arranged to electrically connect with bumps on a package substrate; and
an interposer substrate with a plurality of TSVs (through-silicon vias) that electrically couple to the lower contacts, wherein each of said bars includes: at least one of said TSVs, at least one via through the metallization and dielectric layers, and at least one upper contact.

10. The interposer of claim 9, wherein at least one of the inductors is a loop inductor with an outer diameter, and wherein each of the bars is distanced from the at least one inductor by at least 40% of the outer diameter.

11. The interposer of claim 10, wherein the bars are evenly spaced around a perimeter of the cage and separated from each other by no more than 20% of the outer diameter.

12. The interposer of claim 9, further comprising a conductive surface or mesh electrically connecting the bars on a lower side of the interposer substrate.

13. A method of reducing electromagnetic interference between multiple oscillators in a microelectronic assembly, the method comprising:
    coupling at least one IC (integrated circuit) die to a substrate in a flip-chip configuration, the at least one IC die having drive cores for the oscillators, and as part of said coupling:
        electrically connecting each drive core to an inductor on the substrate; and
        providing an upper boundary of a conductive cage around at least one of said inductors by electrically connecting a conductive surface or mesh layer of the at least one IC die to conductive cage bars on the substrate.

14. The method of claim 13, wherein the substrate includes a conductive surface or mesh layer that forms a lower boundary of the conductive cage.

15. The method of claim 13, wherein at least one of the inductors is a loop inductor with an outer diameter, and wherein each of the bars is distanced from the at least one inductor by at least 40% of the outer diameter.

16. The method of claim 15, wherein the bars are evenly spaced around a perimeter of the cage and separated from each other by no more than 20% of the outer diameter.

17. The method of claim 13, wherein the substrate is an interposer having its upper contacts soldered to contacts on the at least one IC die, and wherein the method further comprises:
    soldering lower contacts of the interposer to internal contacts of a package substrate, wherein said soldering includes providing a lower boundary of the conductive cage by electrically connecting a conductive surface or mesh layer of the package substrate to the conductive bars.

18. The method of claim 13, wherein the substrate includes cage bars for providing each inductor with a respective conductive cage.

19. The method of claim 18, wherein each cage bar includes a contact on the at least one IC die, a contact on the substrate, a solder bump formed between the contacts by said coupling, and a TSV (through-silicon via) in the substrate.

* * * * *